(12) United States Patent
Wang et al.

(10) Patent No.: US 12,035,560 B2
(45) Date of Patent: Jul. 9, 2024

(54) ORGANIC LIGHT-EMITTING DIODE

(71) Applicants: Wuhan China Star Optoelectronics Semiconductor Display Technology Co., Ltd., Hubei (CN); Guangzhou Chinaray Optoelectronic Materials Ltd., Guangdong (CN)

(72) Inventors: Xu Wang, Hubei (CN); Yue Zhang, Hubei (CN); Xianjie Li, Hubei (CN); Munjae Lee, Hubei (CN); Junyou Pan, Hubei (CN); Tao Li, Hubei (CN); Jiahui Tan, Hubei (CN); Xi Yang, Hubei (CN)

(73) Assignees: Wuhan China Star Optoelectronics Semiconductor Display Technology Co., Ltd., Wuhan (CN); Guangzhou Chinaray Optoelectronic Materials Ltd., Guangzhou (CN)

( * ) Notice: Subject to any disclaimer, the term of this patent is extended or adjusted under 35 U.S.C. 154(b) by 1014 days.

(21) Appl. No.: 16/966,246

(22) PCT Filed: Jun. 2, 2020

(86) PCT No.: PCT/CN2020/094008
§ 371 (c)(1),
(2) Date: Jul. 30, 2020

(87) PCT Pub. No.: WO2021/017624
PCT Pub. Date: Feb. 4, 2021

(65) Prior Publication Data
US 2023/0180510 A1 Jun. 8, 2023

(30) Foreign Application Priority Data

Aug. 1, 2019 (CN) .......................... 201910706435.0

(51) Int. Cl.
H10K 50/844 (2023.01)
H10K 71/16 (2023.01)
H10K 85/50 (2023.01)
H10K 85/60 (2023.01)

(52) U.S. Cl.
CPC ........... *H10K 50/844* (2023.02); *H10K 71/16* (2023.02); *H10K 85/50* (2023.02); *H10K 85/633* (2023.02); *H10K 85/654* (2023.02)

(58) Field of Classification Search
CPC .............................. H10K 50/844; H10K 85/50
See application file for complete search history.

(56) References Cited

U.S. PATENT DOCUMENTS

2014/0138636 A1   5/2014  Song
2017/0033170 A1*  2/2017  Kim ..................... H10K 50/858
2018/0151812 A1*  5/2018  Peng .................... H10K 59/35
(Continued)

FOREIGN PATENT DOCUMENTS

CN    104447349    3/2015
CN    107154462    9/2017
(Continued)

*Primary Examiner* — Jay C Chang
*Assistant Examiner* — Mikka Liu

(57) ABSTRACT

The present disclosure relates to an organic light-emitting diode. The organic light-emitting diode includes a substrate, an anode layer, an organic functional layer, a cathode layer, and a cover layer that are sequentially stacked from bottom to top.

10 Claims, 2 Drawing Sheets

(56) References Cited

U.S. PATENT DOCUMENTS

2019/0237697 A1   8/2019  Zhang et al.
2020/0176692 A1*  6/2020  Watabe ................ H10K 85/654

FOREIGN PATENT DOCUMENTS

| CN | 107827809 | 3/2018 |
| CN | 108336247 | 7/2018 |
| CN | 109096246 | 12/2018 |
| CN | 109251148 | 1/2019 |
| CN | 109841647 | 6/2019 |
| CN | 110492017 | 11/2019 |

* cited by examiner

ORGANIC LIGHT-EMITTING DIODE

RELATED APPLICATIONS

This application is a National Phase of PCT Patent Application No. PCT/CN2020/094008 having International filing date of Jun. 2, 2020, which claims the benefit of priority of Chinese Patent Application No. 201910706435.0 filed on Aug. 1, 2019. The contents of the above applications are all incorporated by reference as if fully set forth herein in their entirety.

FIELD AND BACKGROUND OF THE INVENTION

The present disclosure relates to the field of electroluminescence, and more particularly, to an organic light-emitting diode.

Organic light-emitting diode displays are a type of self-luminous display devices which generate excitons by transfer and recombination of carriers between various functional layers and emit light by employing high quantum efficiency organic compounds or metal complexes. Organic light-emitting diode displays possess characteristics of self-illumination, high brightness, high efficiency, high contrast, high responsiveness, etc.

In recent years, luminous efficacy of organic light-emitting diodes (OLEDs) is greatly increased, but internal quantum efficiency of OLEDs approaches theoretical limits. Therefore, improvement of the light out-coupling efficiency has become an effective means to further improve stability and current efficiency of OLEDs, such as accumulation of metal complexes of emission layers and matching of refractive indices between functional layers. In 2003, Riel et al. tried to deposit an inorganic compound ZnSe having a high refractive index on a cathode layer. The difference of refractive indices between functional layers is used to increase the light out-coupling efficiency. Because of limitation caused by high evaporation temperature and slow evaporation rate of inorganic materials, this compound does not have further application in OLEDs. For the high-energy plasma or ultraviolet rays used in the subsequent encapsulation of the OLEDs, a more stable material is needed to prevent damage to internal materials of OLEDs.

Therefore, it is extremely necessary to provide a novel OLED to increase stability and luminous efficiency of OLEDs.

Technical Problems

A main object of the present disclosure is to provide an organic light-emitting diode, which increases the stability of the organic light-emitting diode, increases the efficiency of light out-coupling, and reduces the difficulty of its preparation.

SUMMARY OF THE INVENTION

In order to solve the above problems, the present disclosure proposes an organic light-emitting diode, comprising: a substrate, an anode layer, an organic functional layer, a cathode layer, and a cover layer which are sequentially stacked from bottom to top. Specifically, the anode layer is disposed on the substrate. The organic function layer is disposed on the anode layer. The cathode layer is disposed on the organic function layer. The cover layer is disposed on the cathode layer. The cover layer includes a perovskite-type compound.

Furthermore, the organic light-emitting diode further comprises a light out-coupling layer disposed between the cathode layer and the cover layer.

Furthermore, material of the perovskite-type compound is selected from the group consisting of $ABX_3$-type compounds, carbazole derivatives, diphenylfuran derivatives, aromatic amine derivatives, and triazines derivatives.

Furthermore, in the $ABX_3$-type compounds, X is selected from oxygen, A is selected from the group consisting of divalent elements magnesium, calcium, strontium, barium, and lead, and B is selected from the group consisting of tetravalent elements titanium, silicon, and iron; or X is selected from halogen, A is selected from the group consisting of monovalent alkali metal, aromatic amine ion, and fatty ammonium ion, and B is selected from the group consisting of divalent alkaline earth metal, zinc, germanium, tin, lead, iron, cobalt, copper, nickel, manganese, palladium, cadmium, germanium, and europium; or X is selected from the group consisting of fluorine and chlorine, A is selected from the group consisting of rubidium and cesium, and B is selected from the group consisting of divalent alkaline earth metal, zinc, germanium, tin, lead, iron, cobalt, copper, nickel, manganese, palladium, cadmium, germanium, and europium.

Furthermore, the cover layer comprises an $A_nA'_{1-n}BX_3$-type compound; wherein A and A' are independently selected from the group consisting of different alkali metals and n is a decimal of 0-1; X is selected from oxygen and B is selected from the group consisting of tetravalent element titanium, silicon, and iron; or X is selected from halogen and B is selected from the group consisting of divalent alkaline earth metal, zinc, germanium, tin, lead, iron, cobalt, copper, nickel, manganese, palladium, cadmium, germanium, and europium; or X is selected from fluorine or chlorine, and B is selected from tetravalent element titanium, silicon, and iron.

Furthermore, the cover layer comprises any one of $CsPbCl_3$, $MgSiO_3$, $CH_3NH_3PbCl_3$, $Cs_{0.9}Rb_{0.1}PbCl_3$, $Cs_{0.8}Rb_{0.2}PbCl_3$, $Cs_{0.7}Rb_{0.3}PbCl_3$, $Cs_{0.6}Rb_{0.4}PbCl_3$, $Cs_{0.5}Rb_{0.5}PbCl_3$, $Cs_{0.4}Rb_{0.6}PbCl_3$, $CsPbF_3$, $NaSnF_3$, $KSnF_3$, $RbSnF_3$, or $CsSnF_3$.

Furthermore, the functional layer comprises at least one light-emitting layer, the light-emitting layer comprises an organic light-emitting material or a quantum dot light-emitting material; and wherein the organic light-emitting material is selected from the group consisting of a singlet emitter, a triplet emitter, or thermally activated delayed fluorescent light-emitting material (TADF).

Furthermore, the perovskite-type compound is deposited by a one-step precursor deposition (OSPD), a two-step deposition (SDM), a dual-source vapor deposition (DSVD), or a vapor-phase assisted solution process (VASP).

Furthermore, a thickness of the perovskite-type compound ranges from 10 nm to 300 nm.

Beneficial Effects

Beneficial effects of the present disclosure are that an organic light-emitting diode is provided. By disposing a covering layer on a side of a cathode layer that is away from the functional layer, stability of the organic light-emitting diode and light out-coupling efficiency are increased. Therefore, the adverse effect of external harmful energy on the internal materials of devices can be effectively avoided. Difficulty in manufacturing the OLEDs is also reduced.

Figure 1:
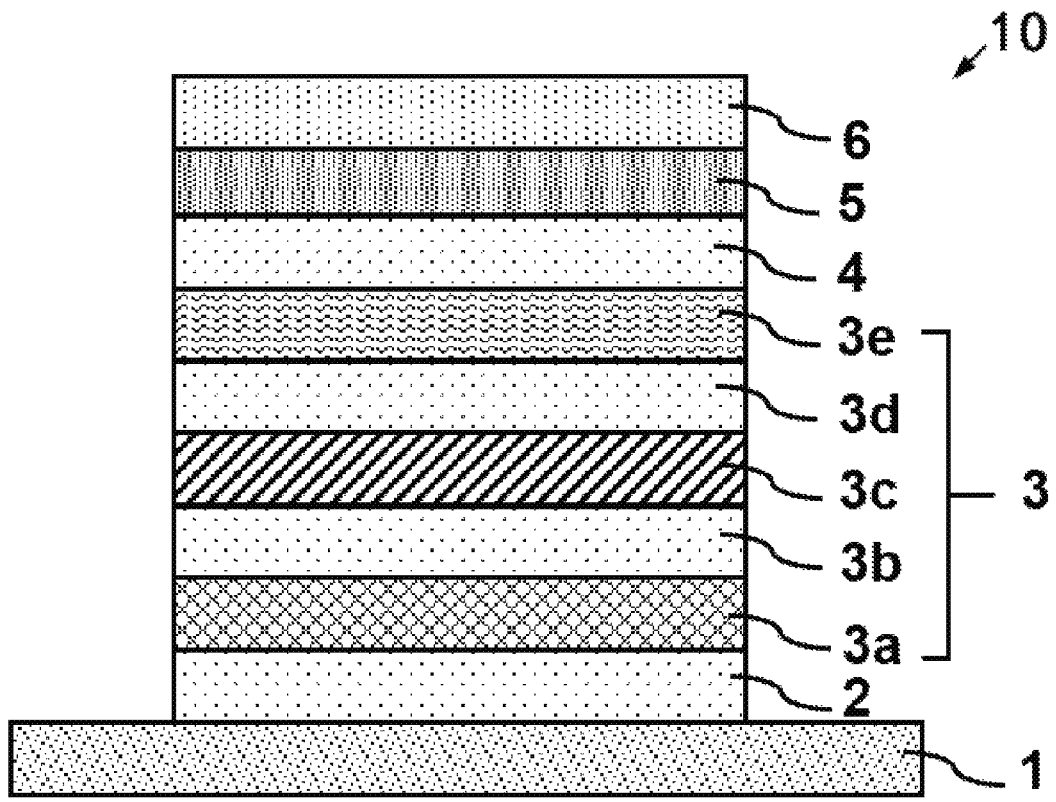
FIG. 1 is a schematic structural diagram of an organic light-emitting diode of the present disclosure.

REFERENCE NUMERALS IN DRAWINGS 1. a substrate, 2. an anode layer, 3. an organic functional layer, 3a. a hole injection layer (HIL), 3b. a hole transport layer (HTL), 3c. a light-emitting layer, 3d. an electron transport layer (ETL), 3e. an electron injection layer (EIL), 4. a cathode layer, 5. a light out-coupling layer, and 6. a cover layer.

DESCRIPTION OF SPECIFIC EMBODIMENTS OF THE INVENTION

In the present disclosure, unless explicitly stated and defined otherwise, the first feature that is on "top" or "bottom" of the second feature may include direct contact between the first and second features and indirect contact between the first and second features that is contacted via additional feature therebetween. Moreover, when the first feature is "on", "on top of", and "above" the second feature, it includes that the first feature is directly above and obliquely above the second feature, or merely indicates that the first feature is in a higher level than the second feature. When the first feature is "under", "on bottom of", and "below" of the second feature, it includes that the first feature is directly below and obliquely below the second feature or merely indicates that the first feature is in a lower level than the second feature.

Please refer to FIG. 1. In an embodiment of the present disclosure, an organic light-emitting diode 10 is provided. The organic light-emitting diode 10 includes a substrate 1, an anode layer 2, an organic functional layer 3, a cathode layer 4, and a cover layer 6. Specifically, the anode layer 2 is disposed on the substrate 1. The organic functional layer 3 is disposed on the anode layer 2. The cathode layer 4 is disposed on the organic functional layer 3. The cover layer 6 is disposed on the cathode layer 4. The cover layer 6 includes a perovskite-type compound.

In the present embodiment, the perovskite structure includes a simple perovskite structure, a double perovskite structure, and a layered perovskite structure. Chemical general formula of the simple perovskite compounds is $ABX_3$, in which X is usually an anion having a small radius. General formula of double perovskite is $A_2B_2X_6$. Composition of layered perovskite is more complicated. In order to effectively form a perovskite-type compound having a suitable band gap, ionic radii of A, B, and X must enable A-X and B-X to reach a suitable bond length to meet the tolerance factor required by perovskite. In addition, choice of ions has an important effect on stability of the compound.

The crystal systems to which the perovskite-type compounds belong mainly include orthogonal, cubic, rhombic, tetragonal, monoclinic, and triclinic systems. A-site ion is usually a rare earth metal element or alkaline earth metal element having a large ionic radius. The A-site ion coordinates with 12 anions to form a densest cubic accumulation, which mainly plays a role in stabilizing the perovskite structure. B is generally selected from an element having a smaller ionic radius (usually a transition metal element), which coordinates with six anions and occupies the center of an octahedron in a cubic dense packing. Due to the variability of valence state of B, B usually becomes the main component that determines many properties of materials of the perovskite-type structure.

In the present embodiment, the perovskite-type compound is selected from an $ABX_3$-type compound, in which when X is selected from oxygen, A is selected from the group consisting of divalent elements magnesium, calcium, strontium, barium, and lead, and B is selected from the group consisting of tetravalent elements titanium, silicon, and iron; when X is selected from halogens, A is selected from the group consisting of monovalent alkali metal, aromatic amine ion, and fatty ammonium ion, B is selected from the group consisting of divalent alkaline earth metals, zinc, germanium, tin, lead, iron, cobalt, copper, nickel, manganese, palladium, cadmium, germanium, and europium. The "halogen" is fluorine, chlorine, bromine, and iodine. The "alkali metal" is lithium, sodium, potassium, rubidium, and cesium. The "alkaline earth metal" is magnesium, calcium, strontium, and barium.

In perovskite-type compounds, the ionic radius affects a size of a unit cell and further affects properties of the compound. In the ions, the smaller the selected anion radius, such as chlorine and bromine, the larger the band gap value. In contrast, the larger the selected metal ion radius, such as monovalent cesium and divalent lead, the larger the band gap value. The wide-gap perovskite compounds formed by such rules can avoid the adverse effect of the cover layer 6 on the light out-coupling efficiency of the OLEDs.

In the $ABX_3$-type compound, when X is selected from fluorine or chlorine, A is selected from rubidium or cesium, and B is selected from divalent alkaline earth metals, zinc, germanium, tin, lead, iron, cobalt, copper, nickel, manganese, palladium, cadmium, germanium, and europium. Preferably, X is selected from chlorine.

In other embodiments, the cover layer 6 includes an $A_nA'_{1-n}BX_3$-type compound. A and A' are independently selected from different alkali metals. n is a decimal of 0-1. X and B have the same definitions as described above. Preferably, A and A' are selected from rubidium and cesium, respectively.

In the present embodiment, the cover layer 6 includes any one of $CsPbCl_3$, $CsPbBr_3$, $CsPbI_3$, $CaTiO_3$, $MgSiO_3$, $CH_3NH_3PbI_3$, $CH_3NH_3PbBr_3$, $NaSnI_3$, $KSnI_3$, $RbSnI_3$, $CsSnI_3$, $CH_3NH_3PbCl_3$, $Cs_{0.9}Rb_{0.1}PbCl_3$, $Cs_{0.8}Rb_{0.2}PbCl_3$, $Cs_{0.7}Rb_{0.3}PbCl_3$, $Cs_{0.6}Rb_{0.4}PbCl$, $Cs_{0.5}Rb_{0.5}PbCl_3$, $Cs_{0.4}Rb_{0.6}PbCl_3$, $CsPbF_3$, $NaSnF_3$, $KSnF_3$, $RbSnF_3$, or $CsSnF_3$.

Preferably, the cover layer 6 is selected from compounds having an anion with a small radius and a cation with a large radius, such as any one of $CsPbCl_3$, $MgSiO_3$, $CH_3NH_3PbCl_3$, $Cs_{0.9}Rb_{0.1}PbCl_3$, $Cs_{0.8}Rb_{0.2}PbCl_3$, $Cs_{0.7}Rb_{0.3}PbCl_3$, $Cs_{0.5}Rb_{0.5}PbCl_3$, $Cs_{0.5}Rb_{0.55}PbCl_3$, $Cs_{0.4}Rb_{0.6}PbCl_3$, $CsPbF_3$, $NaSnF_3$, $KSnF_3$, $RbSnF_3$, or $CsSnF_3$.

In the present embodiment, the band gap Eg of the cover layer 6 is greater than 2.8 eV, and more preferably, greater than 2.9 eV.

When the band gap Eg of the cover layer 6 is greater than or equal to 2.8 eV, the cover layer 6 may be used in an organic light-emitting diode having a peak emission wavelength of 445 nm or more. When the band gap Eg of the cover layer 6 is greater than or equal to 2.43 eV, the cover layer 6 can be used i an n the organic light-emitting diode having a peak emission wavelength greater than 510 nm. When the band gap Eg of the cover layer 6 is greater than or equal to 2.03 eV, the cover layer 6 can be used in an organic light-emitting diode having a peak emission wavelength greater than 610 nm.

In the present embodiment, the perovskite-type compound mainly absorbs ultraviolet light having a wavelength ranging less than 400 nm. An extinction coefficient at 450 nm is less than 0.1.

A transmittance of the cover layer 6 is more than 60% for visible light, more preferably, a transmittance of more than 70%, more preferably, a transmittance of more than 85%, and most preferably, a transmittance of nearly 100%.

In the present embodiment, the perovskite-type compound is deposited by methods, such as a one-step precursor deposition (OSPD), a two-step deposition (SDM), a dual-source vapor deposition (DSVD), or a vapor-phase assisted solution process (VASP), to perform the deposition of the cover layer 6. The method of using a spin coating precursor solution and annealing to obtain perovskite at one time is called a one-step deposition, which is often used in organic-inorganic hybrid perovskite. Operation of this method is simple. In the two-step deposition, a type of inorganic compound is spin-coated and then placed in a solution. Such method can effectively control its morphology. The dual-source vapor deposition can prepare uniform thin films with fewer defects. The vapor-phase assisted solution process takes advantage of the gas-phase and liquid-phase preparation methods to solve the problem of heterogeneity.

In the present embodiment, the cover layer 6 is vacuum-evaporated. Preferably, the double-source vapor deposition is used for obtaining the cover layer 6 having fewer defects and a controllable element content.

In the present embodiment, a thickness of the perovskite-type compound ranges from 10 nm to 300 nm. Preferably, the thickness ranges from 10 nm to 200 nm.

In the present embodiment, the organic functional layer 3 includes one or more of an electron injection layer 3e, an electron transport layer 3d, a hole injection layer 3a, a hole transport layer 3b, or a light-emitting layer 3c. The organic functional layer 3 includes at least one light-emitting layer 3c. Preferably, the organic functional layer 3 includes a hole injection layer 3a, a hole transport layer 3b, a light-emitting layer 3c, an electron transport layer 3d, and an electron injection layer 3e, which are sequentially stacked from bottom to top. More preferably, the organic functional layer 3 includes a hole transporting layer 3b, a light-emitting layer 3c, and an electron transporting layer 3d, which are sequentially stacked from bottom to top.

The light-emitting layer 3c includes an organic light-emitting material or a quantum dot light-emitting material. The organic light-emitting material is selected from a s a singlet emitter, a triplet emitter, or thermally activated delayed fluorescent light-emitting material (TADF).

The quantum dot light-emitting material, singlet light emitter, triplet light emitter, and thermally activated delayed fluorescent light-emitting material are described in detail below.

1. Quantum Dot Light-Emitting Material

Generally, light-emitting quantum dots can emit light having a wavelength ranging from 380 nanometers to 2500 nanometers. For example, it has been found that an emission wavelength of a quantum dot having a CdS core ranges from about 400 nm to 560 nm. An emission wavelength of a quantum dot having a CdSe core ranges from about 490 nm to 620 nm. An emission wavelength of a quantum dot having a CdTe core ranges from about 620 to 680 nanometers. An emission wavelength of a quantum dot having InGaP cores ranges from about 600 to 700 nanometers. An emission wavelength of a quantum dot with PbS cores ranges from about 800 to 2500 nanometers. An emission wavelength of a quantum dot with PbSe cores ranges from about 1200 nm to 2500 nm. The emission wavelength of a quantum dot with CuInGaS cores ranges from about 600 nm to 680 nm. An emission wavelength of a quantum dot with ZnCuInGaS cores ranges from about 500 nm to 620 nm. An emission wavelength of a quantum dot of the CuInGaSe core ranges from about 700 nm to 1000 nm.

In a preferred embodiment, the quantum dot material includes at least one type of blue light that is capable of emitting light having an emission peak at a wavelength ranging from 450 nm to 460 nm, or green light having an emission peak at a wavelength ranging from 520 nm to 540 nm, or red light having an emission peak at a wavelength ranging from 615 nm to 630 nm, or a mixture thereof.

The contained quantum dot can be selected from special chemical composition, morphology, and/or size to obtain light with a desired wavelength under electrical stimulation. A narrow particle size distribution of the quantum dot enables the quantum dot to have a narrower emission spectrum. In addition, according to different chemical compositions and structures being used, sizes of the quantum dot need to be adjusted within the size range as described above, so as to obtain luminescence properties of the desired wavelength.

Preferably, the light-emitting quantum dot is a semiconductor nanocrystal. In one embodiment, a size of the semiconductor nanocrystal ranges from about 5 nanometers to about 15 nanometers. In addition, according to the different chemical composition and structure being used, a size of the quantum dot needs to be adjusted within the size range as described above, so as to obtain the luminescence properties of the desired wavelength.

The semiconductor nanocrystal includes at least one semiconductor material, in which the semiconductor material may be selected from the group consisting of binary or polyvalent semiconductor compounds of group IV, group II-VI, group I-V, group III-V, group III-VI, group IV-VI, group I-III-VI, group II-IV-VI, group II-IV-V, and mixtures thereof. Examples of specific semiconductor materials include, but are not limited to, group IV semiconductor compounds which consisting of elemental Si, Ge, and C, and binary compounds SiC and SiGe; group II-VI semiconductor compounds which consisting of binary compounds, ternary compounds, and quaternary compounds, the binary compounds include CdSe, CdTe, CdO, CdS, CdSe, ZnS, ZnSe, ZnTe, ZnO, HgO, HgS, HgSe, and HgTe, the ternary compounds include CdSeS, CdSeTe, CdSTe, CdZnS, CdZnSe, CdZnTe, CgHgS, CdHgSe, ZnSeS, ZnSeTe, ZnSTe, HgSeS, HgSeTe, HgSTe, HgZnS, and HgSeSe, the quaternary compounds include CgHgSeS, CdHgSeTe, CgHgSTe, CdZnSeS, CdZnSeTe, HgZnSte, CdZnSTe, and HgZnSeS; group III-V semiconductor compounds which consisting of binary compounds, ternary compounds, and quaternary compounds, the binary compounds include AlN, AlP, AlAs, AlSb, GaN, GaP, GaAs, GaSb, InN, InP, InAs, and InSb, the ternary compounds include AlNP, AlNAs, AlNSb, AlPAs, AlPSb, GaNP, GaNAs, GaNSb, GaPAs, GaPSb, InNP, InNAs, InNSb, InPAs, and InPSb, the quaternary compounds include GaAlNAs, GaAlNSb, GaAlPAs, GaInNP, GaInNAs, GaInNSb, GaInPAs, GaInPSb, InAlNP, InAlNAs, InAlNSb, InAlPAs, and InAlPSb; group IV-VI semiconductor compounds which consisting of binary compounds, ternary compounds, and quaternary compounds, the binary compounds include SnS, SnSe, SnTe, PbSe, PbS, and PbTe, the ternary compounds include SnSeS, SnSeTe, SnSTe, SnPbS, SnPbSe, SnPbTe, PbSTe, PbSeS, and PbSeTe, the quaternary compounds include SnPbSSe, SnPbSeTe, and SnPbSTe.

In a preferred embodiment, the light-emitting quantum dot comprises a group II-VI semiconductor material, and is preferably selected from CdSe, CdS, CdTe, ZnO, ZnSe, ZnS, ZnTe, HgS, HgSe, HgTe, CdZnSe, and any combination thereof. In a suitable embodiment, the CdSe material is used as a light-emitting quantum dot for visible light because the synthesis of CdSe is relatively mature.

In another preferred embodiment, the light-emitting quantum dot includes a III-V semiconductor material, and is preferably selected from InAs, InP, InN, GaN, InSb, InAsP, InGaAs, GaAs, GaP, GaSb, AlP, AlN, AlAs, AlSb, CdSeTe, ZnCdSe, and any combination thereof.

In another preferred embodiment, the light-emitting quantum dot comprises a group IV-VI semiconductor material, and is preferably selected from PbSe, PbTe, PbS, PbSnTe, $Tl_2SnTe_5$, and any combination thereof.

In a preferred embodiment, the quantum dot has a core-shell structure. The core and the shell include one or more semiconductor materials identically or differently.

The core of the quantum dot may be selected from binary or polyvalent semiconductor compounds of group IV, group II-VI, group II-V, group III-V, group III-VI, group IV-VI, group I-III-VI, group II-IV-VI, group II-IV-V in periodic table of elements. Specific examples for core of the quantum dot include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InSb, AlAs, AlN, AlP, AlSb, PbO, PbS, PbSe, PbTe, Ge, Si, and alloys or mixtures of any combination thereof.

The shell of the quantum dot is selected from the same or different semiconductor material from the cores. The semiconductor material that can be used for the shell of the quantum dot includes group IV, group II-VI, group II-V, group III-V, group III-VI, group IV-VI, group I-II-VI, group II-IV-VI, group II-IV-V in periodic table of elements. Specific examples for core of the quantum dot include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InSb, AlAs, AlN, AlP, AlSb, PbO, PbS, PbSe, PbTe, Ge, Si, and alloys or mixtures of any combination thereof.

In a preferred embodiment, the semiconductor material used for the shell has a larger band gap than the core. Particularly preferably, the shell and the core have a type I semiconductor heterojunction structure.

In another preferred embodiment, the semiconductor material used for the shell has a smaller band gap than the core.

In a preferred embodiment, the semiconductor material used for the shell has an atomic crystal structure that is the same as or close to the core. Such choice is beneficial to reduce stress between the core and the shell and thus the quantum dot is more stable.

In a preferred embodiment, the used core-shell quantum dot are as follows:
Red light: CdSe/CdS, CdSe/CdS/ZnS, CdSe/CdZnS, etc.;
Green light: CdZnSe/CdZnS, CdSe/ZnS, etc.;
Blue light: CdS/CdZnS, CdZnS/ZnS, etc.

A manufacturing method of the quantum dot is a colloidal growth process. In a preferred embodiment, a m manufacturing method of monodispersed quantum dots is selected from the group consisting of hot-injecting process and/or heating-up process.

In a preferred embodiment, a surface of the quantum dot includes an organic ligand. The organic ligands can control a growth process of the quantum dot, regulate an appearance of the quantum dot, and reduce surface defects of the quantum dot, thereby increasing luminous efficiency and stability of the quantum dot. The organic ligand may be selected from the group consisting of pyridine, pyrimidine, furan, amine, alkylphosphine, alkylphosphine oxides, alkylphosphonic acid or alkylphosphinic acid, alkylthiol, etc. Examples of the specific organic ligands include, but are not limited to, tri-n-octylphosphine, tri-n-octylphosphine oxide, trihydroxypropylphosphine, tributylphosphine, tris (dodecyl) phosphine, dibutyl phosphite, tributyl phosphite, octadecyl phosphite, trilauryl phosphite, tri(dodecyl) phosphite, triisodecyl phosphite, bis(2-ethylhexyl) phosphate, Tris(tridecyl) phosphate, hexadecylamine, oleylamine, octadecylamine, dioctadecylamine, trioctadecylamine, bis(2-ethylhexyl) amine, octylamine, dioctylamine, trioctylamine, dodecylamine, didodecylamine, tridodecylamine, hexadecylamine, phenyl phosphate, hexyl phosphate, tetradecyl phosphate, octyl phosphate, n-octadecyl phosphate, propylene diphosphate, dioctyl ether, diphenyl ether, octyl mercaptan, and dodecyl mercaptan.

In another preferred embodiment, a surface of the quantum dot includes an inorganic ligand. A quantum dot protected by the inorganic ligand can be obtained by ligand exchange of the organic ligand on the surface of the quantum dots. Examples of the specific inorganic ligand include, but are not limited to, $S^{2-}$, $HS^-$, $Se^{2-}$, $HSe^-$, $Te^{2-}$, $HTe^-$, $TeS^{2-}$, $OH^-$, $NH^{2-}$, $PO_4^{3-}$, $MoO_4^{2-}$, etc.

In the present embodiment, the surface of the quantum dot has one or more of the same or different ligands.

In a preferred embodiment, the emission spectrum exhibited by the monodispersed quantum dot has a symmetrical peak shape and a narrow half-peak width. Generally, the better the monodispersity of the quantum dot, the more symmetrical the light emission peak is exhibited and the narrower the half-peak width. Preferably, the half-peak width of the quantum dot is less than 70 nanometers; more preferably, the half-peak width of the quantum dot is less than 40 nanometers; and most preferably, the half-peak width of the quantum dot is less than 30 nanometers.

A luminescent quantum efficiency of the quantum dot is 10%-100%. Preferably, the luminescent quantum efficiency of the quantum dot is greater than 50%; more preferably, the luminescent quantum efficiency of the quantum dot is greater than 80%; and most preferably, the luminescent quantum efficiency of the quantum dot is greater than 90%.

2. Singlet Light Emitter

Singlet emitters often have longer conjugated π-electron systems. Until now, there have been many examples, such as styrylamine and its derivatives, indenofluorene and its derivatives, and triarylamine derivatives of fluorene.

In a preferred embodiment, the singlet light emitter may be selected from the group consisting of mono-styrylamine, di-styrylamine, tri-styrylamine, quaternary styrylamine, styrylphosphine, styryl ether, and arylamine.

A monostyrene styrylamine refers to a compound that contains an unsubstituted or substituted styryl group and at least one amine, preferably an aromatic amine. A binary styrylamine refers to a compound that contains two unsubstituted or substituted styryl groups and at least one amine, preferably an aromatic amine. A ternary styrylamine refers to a compound that contains three unsubstituted or substituted styryl groups and at least one amine, preferably an aromatic amine. A quaternary styrylamine refers to a compound that contains four unsubstituted or substituted styryl groups and at least one amine, preferably an aromatic amine. A preferred styrene is stilbene, which may be further substituted. Corresponding definitions of phosphines and ethers are similar to amines. An arylamine or aromatic amine refers to a compound that contains three unsubstituted or substituted aromatic ring or heterocyclic systems that are directly attached to a nitrogen. At least one of the aromatic or heterocyclic ring systems is preferably selected from a fused ring system, and preferably contains at least 14 aromatic ring atoms. Among them, preferred examples are aromatic anthraceneamine, aromatic anthracene diamine, aromatic fluorene diamine, aromatic fluorene diamine, aromatic dramine, and aromatic drodiamine. An aromatic anthraceneamine refers to a compound in which a divalent arylamine group is directly attached to the anthracene, preferably at 9-position. An aromatic anthracene diamine refers to a compound in which two binary arylamine groups are directly connected to the anthracene, preferably at 9-position and 10-position. Aromatic aminopyrene, aromatic diaminopyrene, aromatic trexamine and aromatic trexamide are similarly defined, in which the binary arylamine group is preferably attached to the 1-position, or 1-position and 6-position of fluorene.

Examples of the singlet light emitters based on stilbene and derivatives thereof are as set forth in U.S. Pat. No. 5,121,029.

Preferably, the singlet light emitter is selected from indenofluorene-amine and indenofluorene-diamine, benzoindenofluorene-amine and benzoindenofluorene-diamine, and dibenzoindenfluorene-amine and dibenzoindenofluorene-diamine.

Preferably, the singlet light emitter is selected from a fluorene-based fused ring system.

More preferred singlet light emitters can be selected from fluorene derivatives, such as triarylamine derivatives of fluorene, triarylamine derivatives of fluorene containing dibenzofuran units, and other triarylamine derivatives of fluorene with specific structures. Other materials that can be used as singlet emitters are polycyclic aromatic hydrocarbon compounds, especially derivatives of the following compounds: anthracene such as 9,10-bis(2-naphthracene), naphthalene, tetrabenzene, xanthene, phenanthrene, fluorene (such as 2,5,8,11-tetra-t-butylfluorene), indenofluorene, phenylene such as (4,4'-bis(9-ethyl-3-carbazolevinyl)-1,1'-biphenyl), diindenofluorene, decacyclene, hexabenzobenzene, pyrene, spirobifluorene, arylfluorene, arylene vinylene, cyclopentadiene such as tetraphenylcyclopentadiene, rubrene, coumarin, rhodamine, quinacridone, pyran such as 4(dicyanomethylene)-6-(4-p-dimethylaminostyryl-2-methyl)-4H-pyran (DCM), thiapyran, bis(azinyl) imine boron compound, bis(azinyl) methylene compound, carbostyryl compound, oxazinone, benzoxazole, benzothiazole, benzo imidazole, and pyrrolopyrrole dione.

3. Triplet Emitter

Triplet emitters are also called phosphorescent emitters. In a preferred embodiment, the triplet emitter is a metal complex having a general formula M (L) n, where M is a metal atom, and L may be the same or different each time, which is an organic ligand and is connected to the metal atom M by one or more position bonding or coordination, and n is an integer between 1 and 6. Preferably, the triplet emitter contains a chelating ligand, i.e., a ligand, and is coordinated to the metal via at least two binding sites. It is particularly preferred that the triplet emitter contains two or three identical or different bidentate ligands or multidentate ligands. Chelating ligands are beneficial for improving stability of metal complexes. In a preferred embodiment, the metal complexes that can be used as a triplet emitter include the following forms:

The metal atom M is selected from transition metal elements, lanthanides, and actinides, is preferably selected from the group consisting of Ir, Pt, Pd, Au, Rh, Ru, Os, Re, Cu, Ag, Ni, Co, W, and Eu, and is particularly preferably selected from the group consisting of Ir, Au, Pt, W, and Os.

4. Thermally Activated Delayed Fluorescent Light-Emitting Material (TADF)

Traditional organic fluorescent materials can only employ 25% of singlet excitons formed by electronic excitation to emit light and an internal quantum efficiency of the OLED is low (up to 25%). Although phosphorescent material enhances an intersystem crossing because of strong spin-orbit coupling of a heavy atom center, the singlet excitons and triplet excitons formed by electrical excitation can be effectively used to make the internal quantum efficiency of the OLED reach 100%. However, the following problems limit applications of phosphorescent materials in OLEDs, including expensive cost of phosphorescent materials, poor stability of the materials, and severe efficiency roll-off of the OLEDs. Thermally activated delayed fluorescent light-emitting materials are the third-generation organic light-emitting materials developed after organic fluorescent materials and organic phosphorescent materials. This type of material generally has a small singlet-triplet energy level difference ($\Delta Est$). Triplet excitons can be converted into singlet excitons by intersystem crossing to emit light, which can make full use of the singlet and triplet excitons formed under electrical excitation. The internal quantum efficiency of the OLED can reach 100%. Meanwhile, a structure of material is controllable, the properties are stable, the price is cheap, and no precious metal is needed. Thermally activated delayed fluorescent light-emitting materials possess broad application prospect in the field of OLEDs.

Thermally activated delayed fluorescent light-emitting (TADF) materials need to have a small singlet-triplet energy level difference, preferably $\Delta Est < 0.3$ eV, more preferably $\Delta Est < 0.2$ eV, and most preferably $\Delta Est < 0.1$ eV. In a preferred embodiment, the TADF material has a relatively small $\Delta Est$. In another preferred embodiment, TADF has a better fluorescence quantum efficiency.

In the present embodiment, a light extraction layer 5 is further included between the cathode layer 4 and the cover layer 6.

Material of the light extraction layer 5 needs to have a proper energy level structure. The material of the light extraction layer 5 has a strong absorption in a region at a wavelength less than 400 nm, while having a weak or near zero absorption to visible light at a wavelength greater than 400 nm, so as to prevent the internal materials of the OLED from being damaged by high-energy light in subsequent processes. Moreover, the material of the light extraction layer 5 has a higher refractive index, which can be used to beneficially derive the emission of visible light and increase the luminous efficiency of the organic electronic light-emitting device. When a refractive index of an interface between the material of the light extraction layer 5 and the adjacent electrode is large, the influence of light interference is large. Therefore, a refractive index of the material constituting the light extraction layer 5 is preferably larger than a refractive index of the adjacent electrode.

In the present embodiment, the material of the light extraction layer 5 is selected from the group consisting of organic compounds including a carbazole derivative, a diphenylfuran derivative, an arylamine derivative, and a triazine derivative, and organic compounds containing a structure shown below:

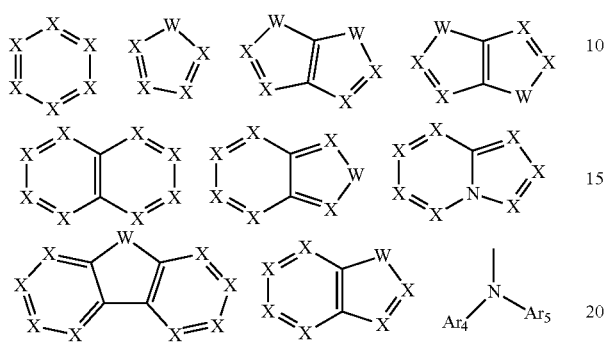

Wherein X is $CR_1$ or N; W is selected from the group consisting of $CR_2R_3$, $NR_4$, C(=O), O, S, and Se; $Ar_4$ and $Ar_5$ are selected from the group consisting of aromatic groups or heterocyclic groups having 5 to 60 substituted or unsubstituted ring atoms; or non-aromatic ring systems having 3 to 25 substituted or unsubstituted ring atoms.

Each occurrence of $R_1$-$R_4$ is independently selected from hydrogen; or D; or a linear alkyl, alkoxy, or thioalkoxy group having 1 to 30 C atoms; or an branched or cyclic alkyl group, alkoxy, or thioalkoxy, or silyl having 3 to 30 C atoms; or keto group having 1 to 30 C atoms, or alkoxycarbonyl group having 2 to 30 C atoms, or aryloxycarbonyl, cyano (—CN), carbamoyl (—C(=O)NH2), haloformyl, formyl (—C(=O)—H), isocyano, isocyanate, thiocyanate or isothiocyanate, hydroxyl, nitro, CF3, Cl, Br, F, crosslinkable groups having 7 to 30 C atoms, or substituted or unsubstituted aromatic or heteroaromatic groups having 5 to 60 ring atoms, or aryloxy or heteroaryloxy groups having 5 to 60 ring atoms, or a combination of these systems.

Furthermore, the light out-coupling material may be a type of compound or a combination thereof including the following groups:

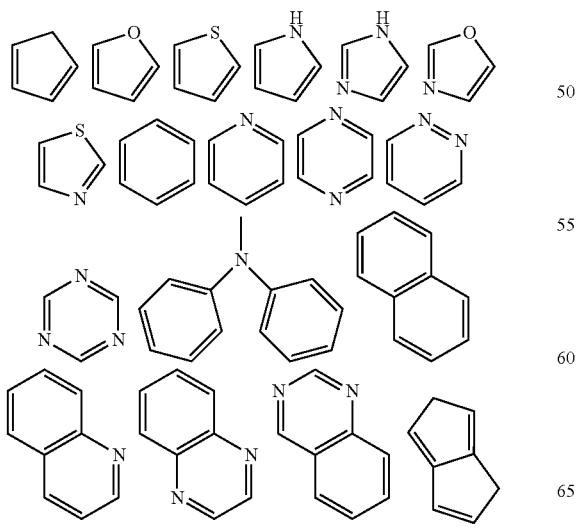

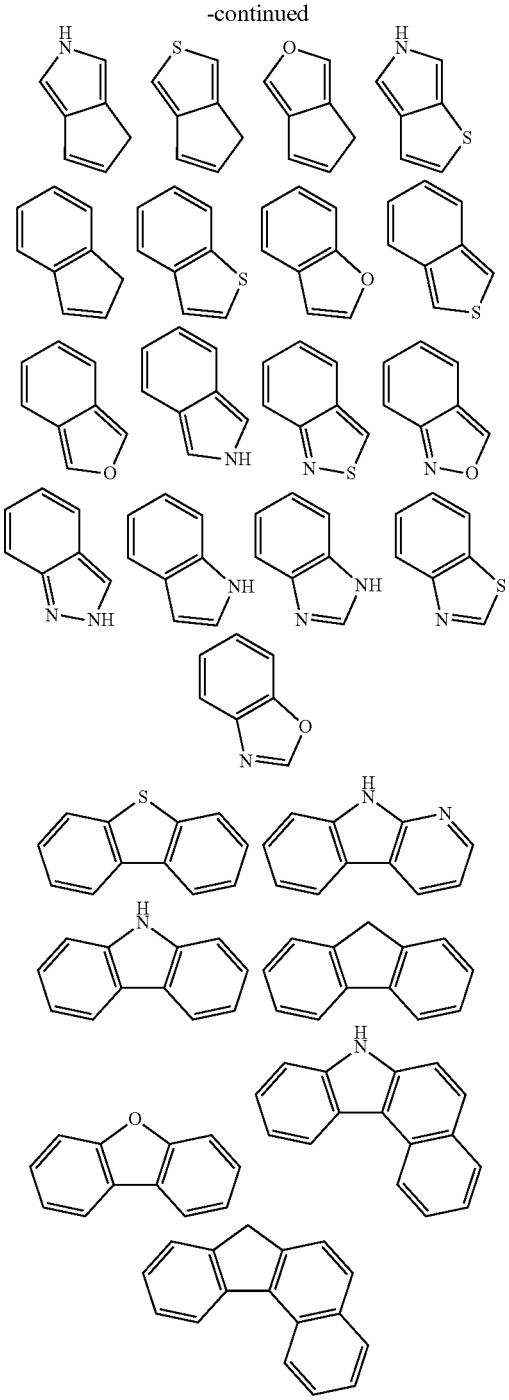

In the present embodiment, the singlet energy (S1) of the material of the light out-coupling layer 5 is greater than or equal to 2.7 eV, preferably greater than or equal to 2.8 eV, and more preferably greater than or equal to 2.85 eV.

In other embodiments, the singlet energy (S1) of the material of the light out-coupling layer 5 is less than or equal to 3.1 eV; preferably, it is less than or equal to 3.0 eV.

In the present embodiment, the material of the light out-coupling layer 5 needs a small extinction coefficient, and the extinction coefficient at a wavelength of 430 nm is less than 0.1; preferably, it is less than 0.003. More preferably, it is less than 0.001. The material of the light out-coupling layer 5 has a high transmittance to visible light and reduces the impact on the light out-coupling efficiency of the device.

The light out-coupling layer 5 has a large extinction coefficient at a wavelength range≤400 nm; preferably, the extinction coefficient at a wavelength of 350 nm is ≥0.3; preferably ≥0.5, more preferably ≥0.7, and most preferably ≥1.0.

The material of the light out-coupling layer 5 needs a higher glass transition temperature to increase thermal stability of the material of the light out-coupling layer 5. The glass transition temperature Tg of the material of the light out-coupling layer is ≥100° C., preferably, Tg≥120° C. In a more preferred embodiment, Tg≥140° C. In a more preferred embodiment, Tg≥160° C. In a most preferred embodiment, Tg≥180° C.

In the present embodiment, a refractive index of the light out-coupling layer 5 is greater than 1.5 at a visible light ranging from 400 nm to 800 nm.

The refractive index of the material of the light out-coupling layer 5 is greater than 1.7 at a wavelength of 630 nm, more preferably greater than 1.8, and most preferably greater than 1.9.

In the present embodiment, a thickness of the light out-coupling layer 5 is 10 nm-200 nm; preferably, the thickness of the light out-coupling layer 5 is 20 nm to 150 nm, more preferably 30 nm to 100 nm, more preferably 40 nm to 90 nm.

In the present embodiment, the material of the cover layer 6 and the light out-coupling layer 5 may be the same, i.e., the material of the perovskite-type compound or the light out-coupling layer 5 is selected from any one of $ABX_3$ type compounds, carbazole derivatives, diphenylfuran derivatives, aromatic amine derivatives, or triazine derivatives.

In the present embodiment, material of the anode layer 2 and the cathode layer 4 is selected from the group consisting of a conductive metal, a metal alloy, a conductive polymer, or a metal oxide.

The material of the anode layer 2 includes a conductive metal, metal oxide, or a conductive polymer. The anode layer 2 can easily inject holes into the hole injection layer 3a (HIL), the hole transport layer 3b (HTL), or the light-emitting layer 3c. An absolute value of the difference between the work function of the anode layer 2 and the HOMO energy level of the emitter in the light-emitting layer 3c, or the valence band energy level or the p-type semiconductor material as a HIL or HTL or an electron blocking layer (EBL), or valence band energy level is less than 0.5 eV, preferably less than 0.3 eV, and most preferably less than 0.2 eV. Examples of the material of the anode layer 2 including, but are not limited to, Al, Cu, Au, Ag, Mg, Fe, Co, Ni, Mn, Pd, Pt, ITO, aluminum doped zinc oxide (AZO), etc. Other suitable materials for the anode layer 2 are known and can be easily selected and used by people skilled in the art. Material of the anode layer 2 can be deposited using any suitable technique, such as a suitable physical vapor deposition method, including radio frequency magnetron sputtering, vacuum thermal evaporation, electron beam (e-beam), etc. In the present embodiment, the anode layer 2 is patterned.

Material of the cathode layer 4 includes a conductive metal or a metal oxide. The cathode layer 4 can easily inject electrons into EIL or ETL or directly into the light-emitting layer 3c. In one embodiment, an absolute value of the difference between the work function of the cathode layer 4 and the light emitter of the light-emitting layer 3c or the LUMO level of n-type semiconductor material as an electron injection layer 3e (EIL), an electron transport layer 3d (ETL), or a hole blocking layer (HBL), or valence band energy level is less than 0.5 eV, preferably less than 0.3 eV, and most preferably less than 0.2 eV. In principle, all materials that can be used as the cathode layer 4 of the OLED may be the material of the cathode layer 4 of the present disclosure. Examples of the material of the cathode layer 4, including but are not limited to, Al, Au, Ag, Ca, Ba, Mg, LiF/Al, MgAg alloy, $BaF_2$/Al, Cu, Fe, Co, Ni, Mn, Pd, Pt, ITO, etc. The material of the cathode layer 4 can be deposited using any suitable technique, such as a suitable physical vapor deposition method, including radio frequency magnetron sputtering, vacuum thermal evaporation, electron beam (e-beam), etc.

In the present embodiment, the organic light-emitting diode according to the present disclosure is an organic light-emitting diode which can be applied to a display device, a lighting device, a light source, or a sensor.

Figure 2:
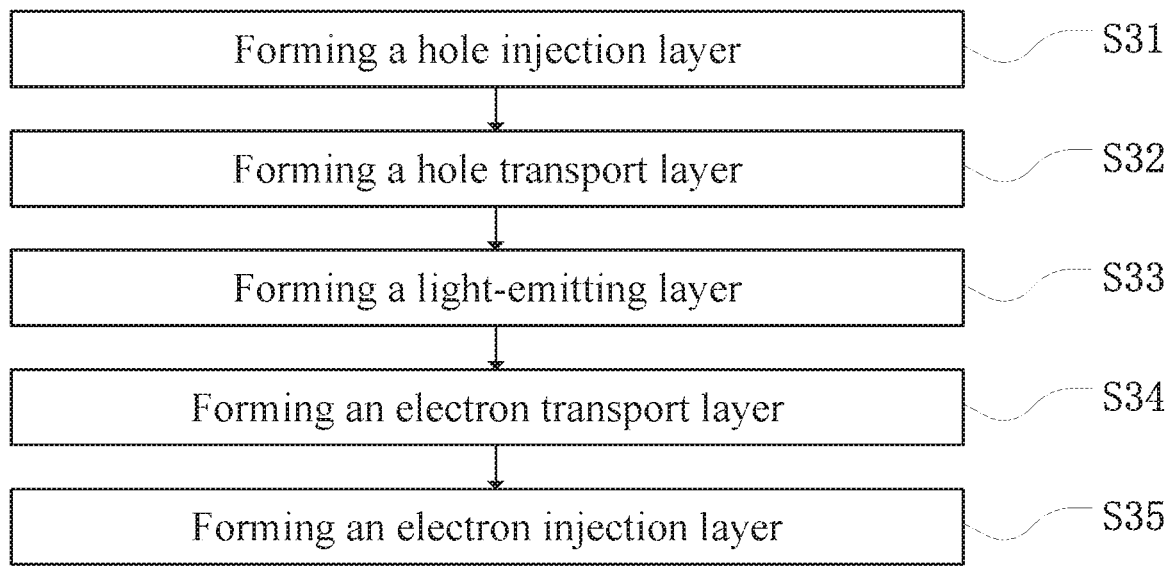
FIG. 2 is a flowchart of manufacturing an organic light-emitting diode of the present disclosure.

Please refer to FIG. 2, the present disclosure also provides a manufacturing method of an organic light-emitting diode, including the following steps:

a step S1 of providing a substrate;

a step S2 of forming an anode layer 2 that includes the follow steps: forming an ITO/Ag/ITO structure on the substrate to form the anode layer 2, ultrasonically cleaning the anode layer 2 with deionized water, acetone, and isopropanol for 15 minutes after cleaning the anode layer 2, then, processing the anode layer 2 in a plasma cleaner for 5 minutes to increase the work function of the anode layer 2;

a step S3 of forming an organic functional layer 3 that includes the follow steps: sequentially forming a hole injection layer 3a, a hole transport layer 3b, a light-emitting layer 3c, an electron transport layer 3d, and an electron injection layer 3e on the anode layer 2;

a step S4 of forming a cathode layer 4 that includes the follow steps: depositing a Mg:Ag layer on the organic functional layer 3 by vacuum evaporation to form the cathode layer 4, in which the doping ratio of Mg:Ag is 9:1 and a thickness is 15 nm.

a step S5 of forming a light out-coupling layer 5 that includes the follow steps: depositing compound CBP on the cathode layer 4 by vacuum evaporation to form the light out-coupling layer 5 having a thickness of 60 nm; and a step S6 of forming a cover layer 6 that includes the follow steps: depositing CsPbCl3 on the light out-coupling layer 5 by vacuum deposition to form the cover layer 6 having a thickness of 50 nm.

Figure 3:
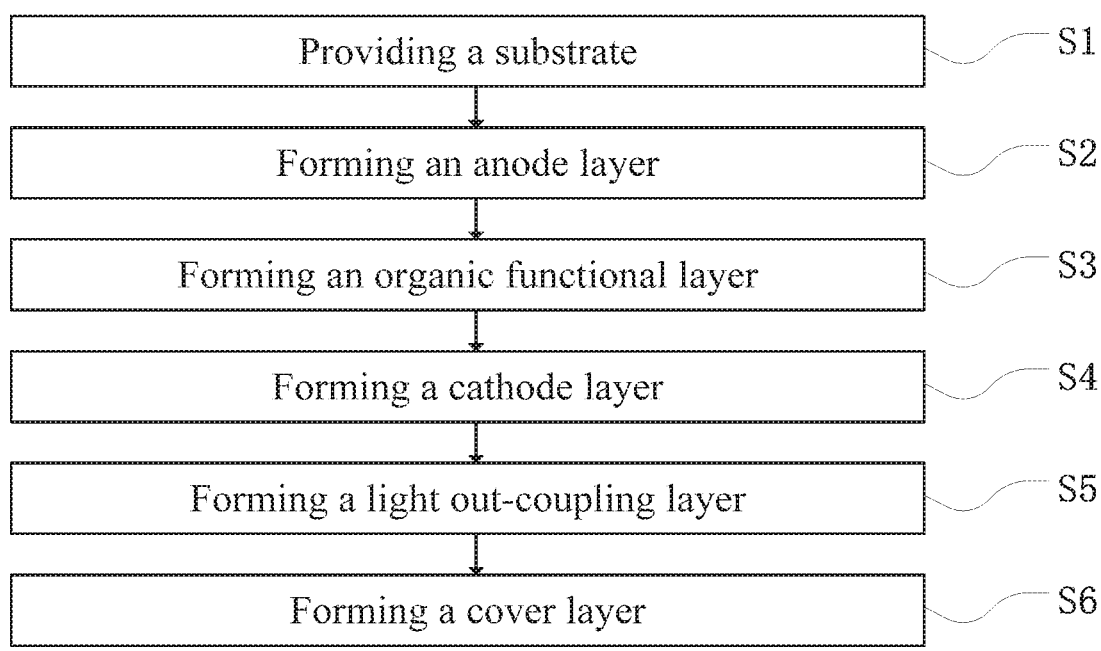
FIG. 3 is a flowchart of manufacturing an organic functional layer of an organic light-emitting diode of the present disclosure.

Please refer to FIG. 3, wherein the step S2 of forming the organic functional layer 3 specifically includes the following steps:

a step S31 of forming a hole injection layer 3a that includes the follow steps: depositing a HATCN material on the anode layer 2 by vacuum evaporation to form a hole injection layer 3a having a thickness of 5 nm and an evaporation rate of 1 Å/s;

a step S32 of forming a hole transport layer 3b that includes the follow steps: depositing a SNFFB material on the hole injection layer 3a by vacuum evaporation to form a hole transport layer 3b having a thickness of 80 nm;

a step S33 of forming a light-emitting layer 3c that includes the follow steps: depositing a light-emitting material on the hole-transporting layer 3b to form the light-emitting layer 3c in which H-1 serves as a host material, Ir (p-ppy)₃ serves as a doping material, a mass ratio of Ir (p-ppy)₃, and H-1 is 1:9, and a thickness is 40 nm;

a step S34 of forming an electron transport layer 3d that includes the follow steps: depositing NaTzF₂ and Liq (mass ratio of 1:1) on the light-emitting layer 3c to form an electron transport layer 3d having a thickness of 30 nm; and a step S35 of forming an electron injection layer 3e, depositing Yb on the electron transport layer 3d by vacuum evaporation to form an electron injection layer 3e having a thickness of 1 nm.

Structures of the involved compounds are as follows:

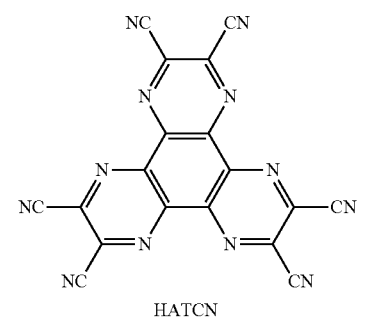

HATCN

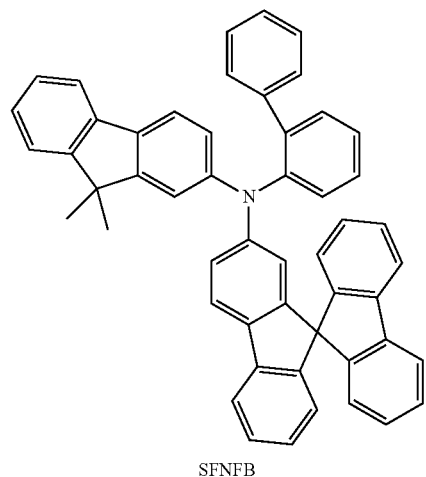

SFNFB

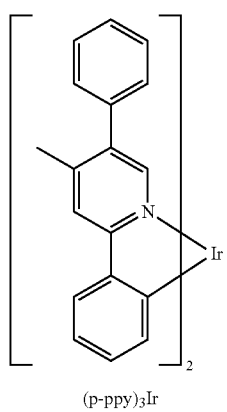

(p-ppy)₃Ir

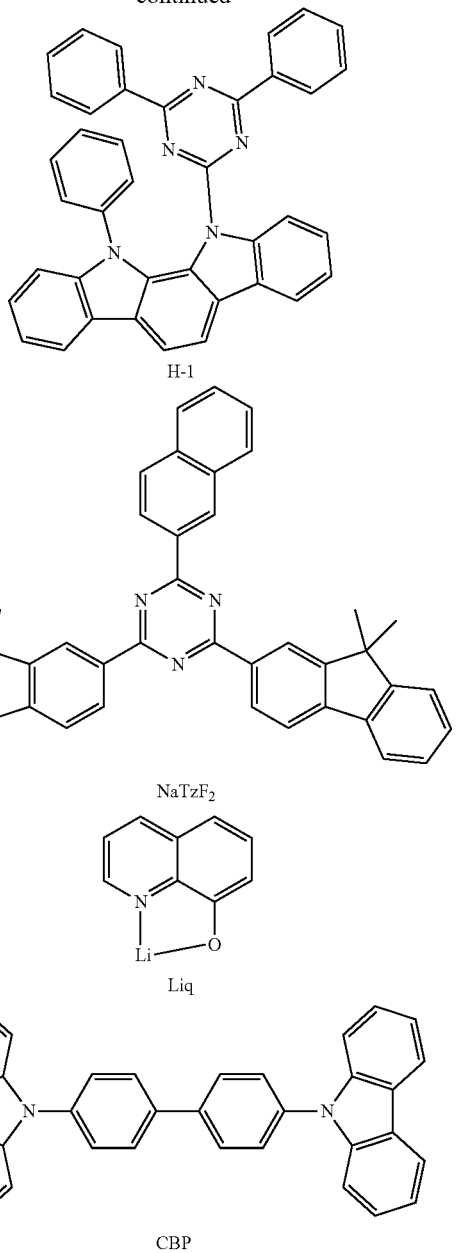

Beneficial effects of the present disclosure are that an organic light-emitting diode and a manufacturing method are provided. By disposing a covering layer on a side of a cathode layer that is away from the functional layer, stability of the organic light-emitting diode and light out-coupling efficiency are increased. Therefore, adverse effect of external harmful energy on the internal materials of devices can be effectively avoided. Difficulty of manufacturing the OLEDs is also reduced.

The above are merely the preferred embodiments of the present disclosure. It should be appreciated that a person skilled in the art may further make modifications and improvements without departing from the principle of the present disclosure, and these modifications and improvements shall also fall within the scope of the present disclosure.

What is claimed is:

1. An organic light-emitting diode, comprising:
   a substrate;
   an anode layer disposed on the substrate;
   an organic functional layer disposed on the anode layer;
   a cathode layer disposed on the organic functional layer; and
   a cover layer disposed on the cathode layer;
   wherein the cover layer comprises a perovskite-type compound, a material of the perovskite-type compound is selected from the group consisting of $ABX_3$-type compounds, carbazole derivatives, diphenylfuran derivatives, aromatic amine derivatives, and triazines derivatives, and in the $ABX_3$-type compounds:
   X is selected from oxygen, A is selected from the group consisting of divalent elements magnesium, calcium, strontium, barium, and lead, and B is selected from the group consisting of tetravalent elements titanium, silicon, and iron; or
   X is selected from halogen, A is selected from the group consisting of monovalent alkali metal, aromatic amine ion, and fatty ammonium ion, and B is selected from the group consisting of divalent alkaline earth metal, zinc, germanium, tin, lead, iron, cobalt, copper, nickel, manganese, palladium, cadmium, germanium, and europium; or
   X is selected from the group consisting of fluorine and chlorine, A is selected from the group consisting of rubidium and cesium, and B is selected from the group consisting of tetravalent element titanium, silicon, and iron.

2. The organic light-emitting diode according to claim 1, wherein the organic light-emitting diode further comprises a light out-coupling layer disposed between the cathode layer and the cover layer.

3. The organic light-emitting diode according to claim 2, wherein a material of the light out-coupling layer is selected from the group consisting of $ABX_3$-type compounds, carbazole derivatives, diphenylfuran derivatives, aromatic amine derivatives, and triazine derivatives.

4. The organic light-emitting diode according to claim 3, wherein in the $ABX_3$-type compounds,
   X is selected from oxygen, A is selected from the group consisting of divalent elements magnesium, calcium, strontium, barium, and lead, and B is selected from the group consisting of tetravalent elements titanium, silicon, and iron; or
   X is selected from halogen, A is selected from the group consisting of monovalent alkali metal, aromatic amine ion, and fatty ammonium ion, and B is selected from the group consisting of divalent alkaline earth metal, zinc, germanium, tin, lead, iron, cobalt, copper, nickel, manganese, palladium, cadmium, germanium, and europium; or
   X is selected from the group consisting of fluorine and chlorine, A is selected from the group consisting of rubidium and cesium, and B is selected from the group consisting of tetravalent element titanium, silicon, and iron.

5. The organic light-emitting diode according to claim 1, wherein the cover layer comprises an $A_nA'_{1-n}BX_3$-type compound;
   wherein A and A' are independently selected from the group consisting of different alkali metals and n is a decimal of 0-1;
   X is selected from oxygen and B is selected from the group consisting of tetravalent element titanium, silicon, and iron; or
   X is selected from halogen and B is selected from the group consisting of divalent alkaline earth metal, zinc, germanium, tin, lead, iron, cobalt, copper, nickel, manganese, palladium, cadmium, germanium, and europium; or
   X is selected from fluorine or chlorine, and B is selected from divalent alkaline earth metals, zinc, germanium, tin, lead, iron, cobalt, copper, nickel, manganese, palladium, cadmium, germanium, and europium.

6. The organic light-emitting diode according to claim 1, wherein the cover layer comprises any one of $CsPbCl_3$, $MgSiO_3$, $CH_3NH_3PbCl_3$, $Cs_{0.9}Rb_{0.1}PbCl_3$, $Cs_{0.8}Rb_{0.2}PbCl_3$, $Cs_{0.7}Rb_{0.3}PbCl_3$, $Cs_{0.6}Rb_{0.4}PbCl_3$, $Cs_{0.5}Rb_{0.5}PbCl_3$, $Cs_{0.4}Rb_{0.6}PbCl_3$, $CsPbF_3$, $NaSnF_3$, $KSnF_3$, $RbSnF_3$, or $CsSnF_3$.

7. The organic light-emitting diode according to claim 1, wherein a band gap of the perovskite-type compound is greater than 2.8 eV; and/or
   the perovskite-type compound mainly absorbs ultraviolet light having a wavelength ranging less than 400 nm, and an extinction coefficient at 450 nm is less than 0.1.

8. The organic light-emitting diode according to claim 1, wherein the organic functional layer comprises at least one light-emitting layer, the light-emitting layer comprises an organic light-emitting material or a quantum dot light-emitting material; and wherein the organic light-emitting material is selected from the group consisting of a singlet emitter, a triplet emitter, or thermally activated delayed fluorescent light-emitting material.

9. The organic light-emitting diode according to claim 1, wherein the perovskite-type compound is deposited by a one-step precursor deposition, a two-step deposition, a dual-source vapor deposition, or a vapor-phase assisted solution process.

10. The organic light-emitting diode according to claim 1, wherein a thickness of the perovskite-type compound ranges from 10 nm to 300 nm.

* * * * *